(12) United States Patent
Ohmi et al.

(10) Patent No.: US 7,764,355 B2
(45) Date of Patent: Jul. 27, 2010

(54) SUBSTRATE STAGE AND HEAT TREATMENT APPARATUS

(75) Inventors: Tadahiro Ohmi, Miyagi (JP); Yusuke Muraoka, Kyoto (JP); Yasuyoshi Miyaji, Kyoto (JP); Yasushi Nagashima, Nara (JP)

(73) Assignees: Tohoku University (JP); Future Vision Inc. (JP)

( * ) Notice: Subject to any disclaimer, the term of this patent is extended or adjusted under 35 U.S.C. 154(b) by 256 days.

(21) Appl. No.: 11/779,571

(22) Filed: Jul. 18, 2007

(65) Prior Publication Data

US 2008/0024742 A1 Jan. 31, 2008

(30) Foreign Application Priority Data

Jul. 26, 2006 (JP) ............... 2006-203729

(51) Int. Cl.
*G03B 27/52* (2006.01)
*G03B 27/58* (2006.01)
*G03B 27/62* (2006.01)

(52) U.S. Cl. ............... 355/30; 355/72; 355/75
(58) Field of Classification Search ............ 355/30, 355/72, 75; 427/457
See application file for complete search history.

(56) References Cited

U.S. PATENT DOCUMENTS

2009/0038946 A1 2/2009 Ohmi et al. ............ 205/95

FOREIGN PATENT DOCUMENTS

| JP | 11-251257 | 9/1999 |
|---|---|---|
| JP | 2001-308075 | 11/2001 |
| JP | 2002-190512 | 7/2002 |
| JP | 2003-086664 | 3/2003 |
| JP | 2004-349612 | 12/2004 |
| WO | WO 2006/134737 A1 | 12/2006 |

OTHER PUBLICATIONS

Korean Office Action in corresponding Korean Application No. KR 2007-0074364 issued Mar. 26, 2009, including English translation thereof.
Korean Office Action issued Dec. 21, 2009 in connection with corresponding Korean Application Serial No. 10-200709974364.
Japanese translation of Korean Office Action provided to Japanese Associate from Korean Attorney.
English translation of extract of Korean Office Action of Dec. 21, 2009 including a listed of cited art and discussion of relevancy thereof.

*Primary Examiner*—Peter B Kim
(74) *Attorney, Agent, or Firm*—Ostrolenk Faber LLP

(57) ABSTRACT

A stage body has a holding surface for placing a substrate thereon. A predetermined embossed configuration is formed by embossing on the holding surface, and thereafter an alumina film in an amorphous state is formed by an anodic oxidation process on the holding surface. The alumina film having an amorphous structure is dense and strong to provide high wear resistance and to substantially prevent separation electrification. This provides a substrate stage having high wear resistance and capable of preventing separation electrification.

10 Claims, 5 Drawing Sheets

APPROXIMATELY HUNDREDS OF NANOMETERS

A

Al-Mg-Zr ALLOY REGION

APPROXIMATELY TENS OF MICROMETERS

P

Po Po Po

Al-Mg-Zr ALLOY REGION

SUBSTRATE STAGE AND HEAT TREATMENT APPARATUS

BACKGROUND OF THE INVENTION

1. Field of the Invention

The present invention relates to a stage for placing thereon a substrate, such as a semiconductor substrate, a glass substrate for a liquid crystal display device, a glass substrate for a photomask, a glass substrate for a plasma display, a substrate for an optical disk and the like, and to a heat treatment apparatus using the same.

2. Description of the Background Art

A substrate processing apparatus (for example, a heat treatment apparatus, a cleaning processing apparatus, a development processing apparatus, and the like) for performing various processes on a substrate requires a stage for placing a substrate to be processed thereon. In particular, stages for use in a heat treatment apparatus are often made of a metal having a high thermal conductivity, e.g. aluminum. The stages made of aluminum, however, have disadvantages to be described below.

One of the disadvantages is that such an aluminum stage has poor wear resistance. Because aluminum is a relatively soft material, the continued use of the stage with aluminum exposed at its holding surface causes the holding surface to be easily worn away after the repeated placement of substrates on the holding surface. As a result, the stage made of aluminum is poor in durability. There arises another problem in that the stage becomes a source of contaminants due to the wear of the stage itself.

Another disadvantage lies in the noticeable occurrence of separation electrification. The "separation electrification" is a phenomenon such that a negative charge (or a positive charge) is generated on a substrate made of an insulating material such as glass when the substrate is removed or separated from a stage made of metal which is a conductive material. The negative charge (or the positive charge) generated on the substrate causes a damage to a device formed on the surface of the substrate, the adsorption of contaminants on the surface of the substrate, and the like. For this reason, the prevention of the separation electrification is a significant challenge in the stage made of aluminum. It should be noted that whether the substrate is charged negatively or positively is determined by the combination of the material of the substrate and the material of the stage, that is, triboelectric series.

To overcome the above-mentioned disadvantages of the stage made of aluminum, a variety of techniques have been devised.

For example, there has been devised a technique for reducing the contact area between the substrate and the stage step by step to thereby suppress static electricity produced during the separation of the substrate from the stage. This technique employs a configuration such that the holding surface of the stage is divided into parts which in turn are sequentially separated from the substrate, to thereby achieve the step-by-step separation of the substrate (as disclosed in, for example, Japanese Patent Application Laid-Open No. 11-251257 (1999)).

As another example, there has been devised a technique for forming a film of alumina ($Al_2O_3$) which is an insulator on the surface of the stage made of aluminum to improve the wear resistance of the stage and to prevent the separation electrification. An example of this technique includes spraying aluminum oxide particles substantially at subsonic speed toward a position for coating to deposit the particles in the form of fine crystallites joined to each other in that position, thereby forming a thin film of alumina having a polycrystalline structure (as disclosed in, for example, Japanese Patent Application Laid-Open No. 2002-190512).

The conventionally devised techniques produce some degree of effect in improving the wear resistance of the substrate stage and in reducing the separation electrification. None of these techniques, however, have achieved the sufficient effect.

For example, the technique disclosed in Japanese Patent Application Laid-Open No. 11-251257 (1999) shows that the step-by-step separation of the substrate from the stage lowers the separation electrification relative to the separation of the entire substrate at a time from the stage. This technique, however, cannot completely prevent the separation electrification.

The technique disclosed in Japanese Patent Application Laid-Open No. 2002-190512 shows an attempt to reduce the influence of a grain boundary layer. However, the influence of the grain boundary layer cannot be completely eliminated because of the use of the polycrystalline structure. When the alumina film having the polycrystalline structure is employed, the repeated use of the stage creates voids at the boundary (grain boundary) between individual crystal grains to cause a crack to occur. In particular, when the alumina film undergoes a thermal shock, such a crack occurs noticeably to finally result in the removal of the alumina film from the stage. Also, the voids provide electrical connection between the substrate and an aluminum region of the stage to spoil the effect of preventing the separation electrification.

SUMMARY OF THE INVENTION

The present invention is intended for a substrate stage for placing a substrate thereon. According to an aspect of the present invention, the substrate stage comprises: a stage body having a holding surface for placing a substrate thereon; and a film of alumina in an amorphous state formed on the holding surface of the stage body.

This substrate stage includes the film of alumina in the amorphous state formed on the holding surface of the stage body for placing the substrate thereon. The alumina film in the amorphous state, which is dense and strong, has high wear resistance and is capable of preventing separation electrification.

Preferably, the holding surface has an embossed configuration formed thereon.

This substrate stage includes the film of alumina in the amorphous state formed on the holding surface having the embossed configuration formed thereon. This provides a good temperature distribution while preventing the separation electrification.

Preferably, the total area of top surfaces of the embossed configuration is less than 50% of the whole area of the holding surface.

Preferably, the top surfaces of the embossed configuration have a substantially circular configuration.

Preferably, the top surfaces having the substantially circular configuration have a diameter of less than 5 mm.

Preferably, the embossed configuration includes embossments having a height of less than 100 μm.

Preferably, the stage body is made of pure aluminum.

Preferably, the stage body is made of an aluminum alloy.

The present invention is also intended for a heat treatment apparatus for cooling or heating a substrate. According to an aspect of the present invention, the heat treatment apparatus comprises: a) a substrate stage for placing a substrate thereon, the substrate stage including a-1) a stage body having a holding surface for placing a substrate thereon, and a-2) a film of alumina in an amorphous state formed on the holding surface of the stage body; and b) a heat treatment mechanism for cooling or heating the substrate stage.

This heat treatment apparatus comprises the substrate stage including the film of alumina in the amorphous state formed on the stage body. This prevents the separation electrification from occurring in the process of cooling or heating the substrate.

Preferably, the holding surface has an embossed configuration formed thereon.

This heat treatment apparatus provides a good temperature distribution of the substrate stage. Therefore, the heat treatment apparatus is capable of uniformly heating or cooling the substrate.

It is therefore an object of the present invention to provide a substrate stage having high wear resistance and capable of preventing separation electrification.

These and other objects, features, aspects and advantages of the present invention will become more apparent from the following detailed description of the present invention when taken in conjunction with the accompanying drawings.

DESCRIPTION OF THE PREFERRED EMBODIMENTS

1. Substrate Holding Apparatus

Figure 1:
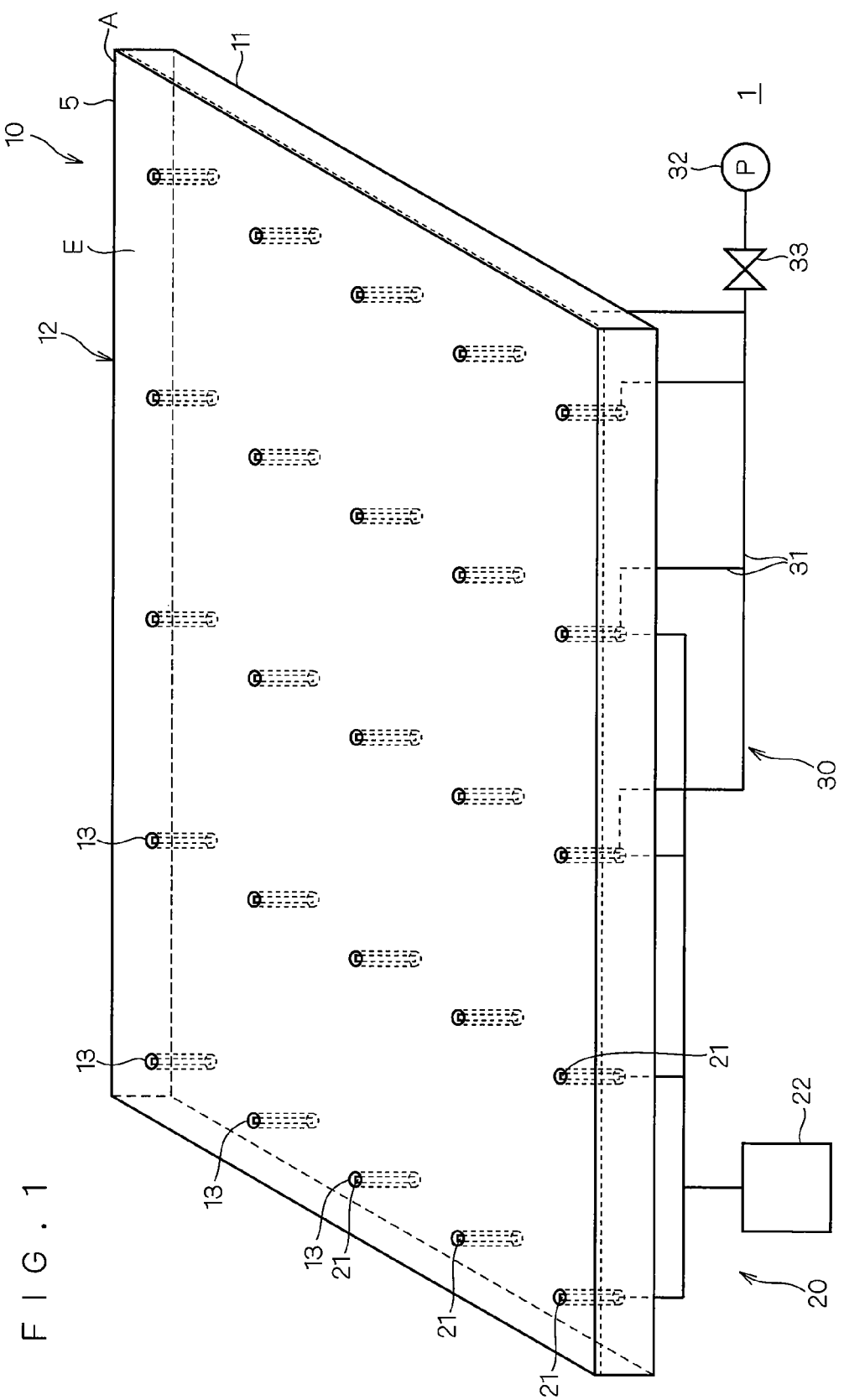
FIG. 1 is a schematic perspective view of a substrate holding apparatus according to the present invention.
Figure 2:
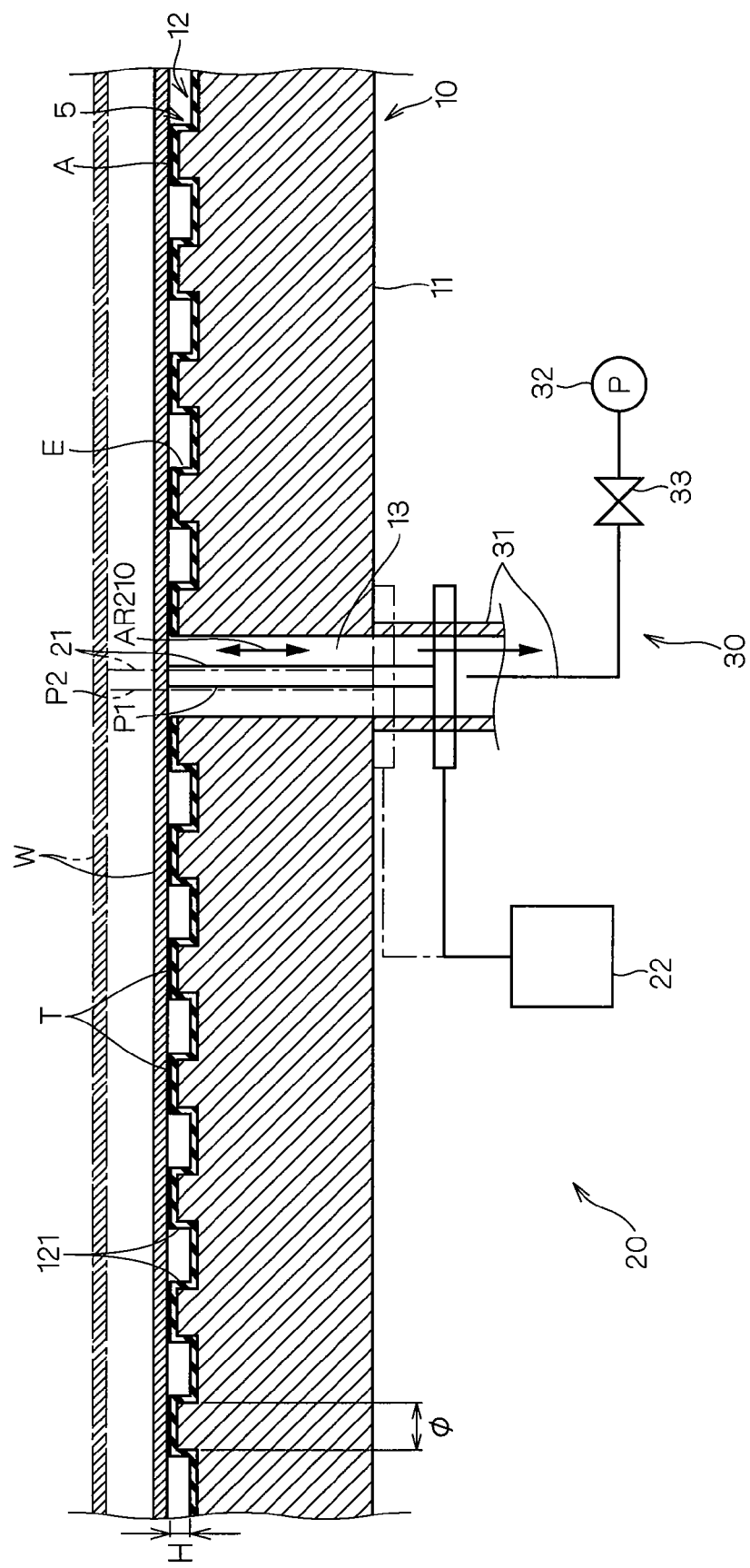
FIG. 2 is a sectional view of the substrate holding apparatus.
Figure 3:
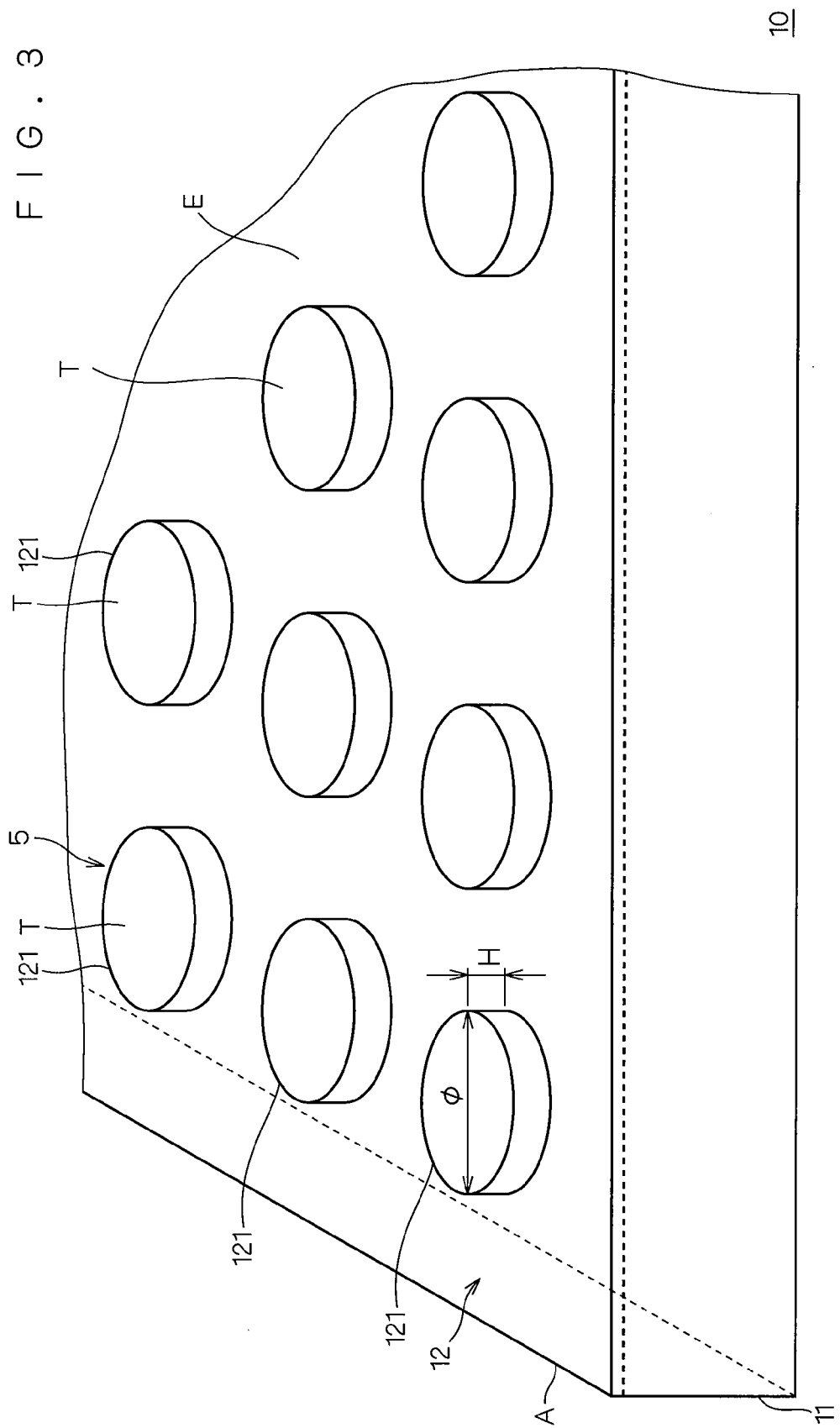
FIG. 3 is an enlarged view of a portion of a substrate stage.

The construction of a substrate holding apparatus 1 configured by using a substrate stage 10 according to the present invention will now be described with reference to FIGS. 1, 2 and 3. FIG. 1 is a schematic perspective view of the substrate holding apparatus 1 according to the present invention. FIG. 2 is a transverse sectional view of the substrate holding apparatus 1 shown in FIG. 1. FIG. 3 is an enlarged view of a portion of the substrate stage 10.

The substrate holding apparatus 1 may be used as an apparatus for holding a substrate to be processed in a variety of substrate processing apparatuses (for example, a heat treatment apparatus for heating and/or cooling a substrate, a development processing apparatus and a cleaning processing apparatus for performing the process of coating a substrate with a chemical solution, a cleaning solution and the like, and a substrate transport apparatus for transporting a substrate between processing apparatuses).

With reference to FIG. 1, the substrate holding apparatus 1 includes the substrate stage 10, a substrate elevating mechanism 20, and a substrate fixing mechanism 30.

The substrate stage 10 includes a stage body 11 which is a plate formed in the shape of a rectangular parallelepiped and made of aluminum and, more specifically, of pure aluminum or an aluminum alloy. The aluminum alloy used herein is preferably an Al—Mg alloy and more preferably an Al—Mg—Zr alloy. In a preferred embodiment to be described below, the stage body 11 is made of an Al—Mg—Zr alloy. The stage body 11 includes a holding surface 12 for placing a substrate W thereon. Although schematically shown in FIG. 1, the holding surface 12 has an embossed configuration E (as shown in FIGS. 2 and 3) formed by embossing throughout the entire area thereof, and is formed with an alumina film A in an amorphous state. The embossed configuration E and the alumina film A will be described later.

The holding surface 12 is a flat surface having an area slightly greater than that of the substrate W to be placed thereon. A predetermined number of through holes 13 functioning as pin holes and as suction holes are formed in predetermined positions of the holding surface 12. The through holes 13 are holes extending through the stage body 11.

The substrate elevating mechanism 20 is a functional part for placing a substrate W on the holding surface 12 and for spacing a substrate W apart from the holding surface 12. The substrate elevating mechanism 20 includes a predetermined number of lift pins 21, and a lift pin drive 22.

As shown in FIG. 2, the lift pins 21 are pins penetrating into the respective through holes 13 from below. The lift pins 21 are movable up and down between a retracted position P1 (indicated by solid lines in FIG. 2) in which the top ends of the respective lift pins 21 are at the same horizontal position as the holding surface 12 (or at a lower position than the holding surface 12) and an extended position P2 (indicated by phantom lines in FIG. 2) in which the top ends of the respective lift pins 21 protrude upwardly from the holding surface 12.

The lift pin drive 22 is a drive for moving the lift pins 21 upwardly and downwardly in synchronization with each other. The lift pin drive 22 moves the lift pins 21 from the extended position P2 to the retracted position P1 to thereby place a substrate W onto the holding surface 12 (as indicated by the arrow AR210). The lift pin drive 22 moves the lift pins 21 from the retracted position P1 to the extended position P2 to thereby space the substrate W apart from the holding surface 12 (as indicated by the arrow AR210).

The substrate fixing mechanism 30 is a functional part for fixing the substrate W placed on the holding surface 12. The substrate fixing mechanism 30 includes a suction line 31, a vacuum pump 32, and an on-off valve 33.

The suction line 31 is piping having distal ends in communication with the respective through holes 13, and a proximal end connected the vacuum pump 32. The on-off valve 33 is interposed in the suction line 31.

When the on-off valve 33 is placed in its open position and the vacuum pump 32 is driven, the pressure in the through holes 13 is reduced. This enables the substrate W placed on the holding surface 12 to be fixed thereto under suction.

The substrate stage 10 may include a meandering cooling pipe line buried therein for circulating a coolant therethrough to thereby cause the substrate stage 10 to function as a cold plate. Likewise, the substrate stage 10 may further include a heating element such as a heater for heating the substrate stage 10 to thereby cause the substrate stage 10 to function as a hot plate.

The through holes 13 described above are configured to function as the pin holes and the suction holes. Alternatively, through holes functioning as pin holes and through holes functioning as suction holes may be provided separately.

The stage body 11 described above is made of an Al—Mg—Zr alloy. However, the stage body 11 may be made of other materials, such as alumina ($Al_2O_3$).

2. Surface Treatment of Holding Surface

Figure 4:
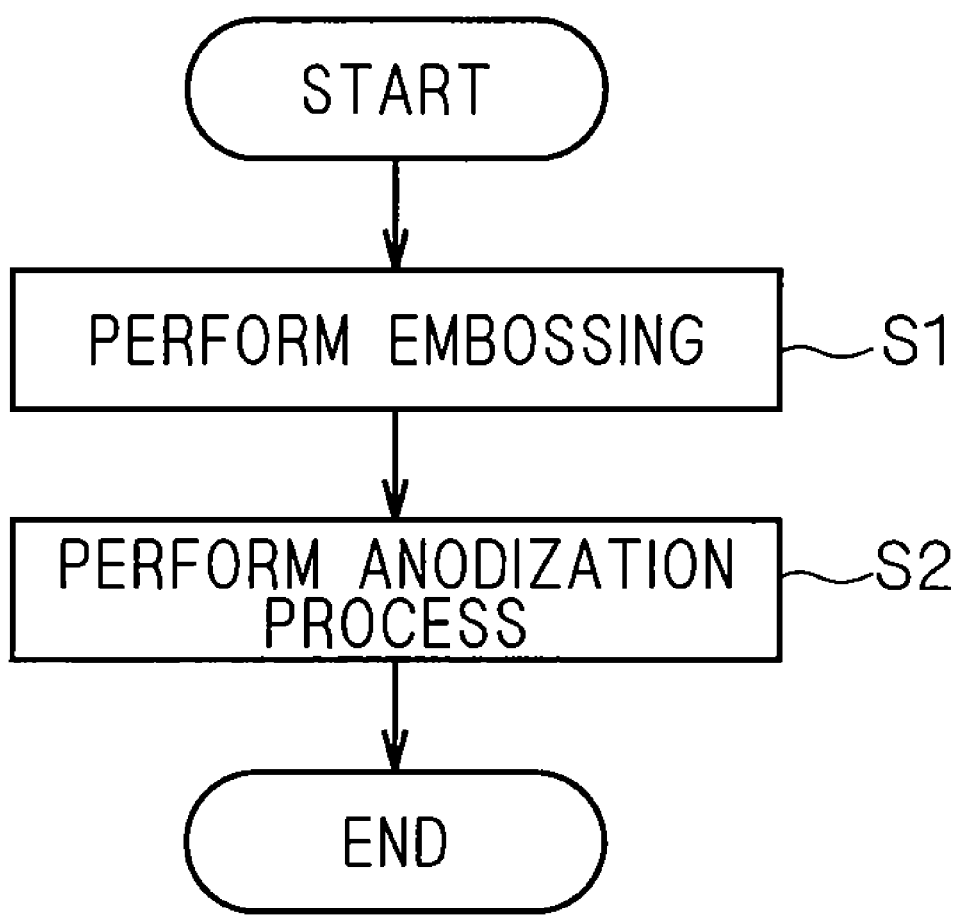
FIG. 4 is a flow chart showing a procedure for processing of a holding surface.

As illustrated in FIGS. 2 and 3, the holding surface 12 of the substrate stage 10 according to this preferred embodiment has the predetermined embossed configuration E formed by embossing, and is formed with the alumina film A in an amorphous state. FIG. 4 is a flow chart showing a procedure for processing of the holding surface 12.

First, embossing is performed on the holding surface 12 to form the predetermined embossed configuration E on the holding surface 12 (in Step S1). It is desirable that the surface treatment using such embossing is carried out by precision machining capable of controlling the surface roughness of the holding surface 12 on the order of micrometers.

Next, an anodic oxidation process is performed on the holding surface 12 subjected to the embossing to form the alumina film A in the amorphous state on the holding surface 12 (in Step S2).

The embossed configuration E formed in Step S1 and the anodic oxidation process performed in Step S2 will be described below.

<2-1. Embossed Configuration>

As illustrated in FIGS. 2 and 3, the embossed configuration E includes a plurality of embossments 121 arranged in a predetermined pattern and each having a flat top surface T, the embossments 121 being configured to have respective upper ends positioned in the same horizontal plane. Since the substrate W is placed on the holding surface 12 having such an embossed configuration, the top surfaces T of the respective embossments 121 serve as a contact surface for contact with the substrate W.

This embossed configuration is provided so that the percentage of the total area of the top surfaces T is less than 50% (preferably 20%) of the whole area of the holding surface 12.

The embossments 121 have a height H (i.e., a vertical level difference between upper and lower portions thereof) of less than 100 μm (preferably 30 μm).

The top surfaces T have a substantially circular configuration having a diameter ϕ of less than 5 mm (preferably 2 mm).

<2-2. Alumina Film A in Amorphous State>

Next, the conditions of the anodic oxidation process for the production of the alumina film A in the amorphous state will be described.

A film of aluminum oxide (i.e., the alumina film A) in an amorphous state is formed by applying a constant voltage to the stage body 11 serving as an anode in a predetermined electrolytic solution to cause the anodic oxidation to occur. Specific conditions of the anodic oxidation process are as follows:

1. A neutral solution is used as the predetermined electrolytic solution (or chemical conversion solution). Specifically, a solution having a pH greater than 5 and less than 9 ($5<pH<9$) is used. More specifically, a carboxylic acid solution having a concentration ranging from 0.1% to 10% is used. It is desirable that the carboxylic acid solution used herein contains a nonaqueous solvent. Preferably, a solution having a hydroxyl group (e.g., alcohol and organic solvent) or the like is used as the nonaqueous solvent.

2. A voltage ranging from 50 to 200 V is applied as the constant voltage.

Figure 5A:
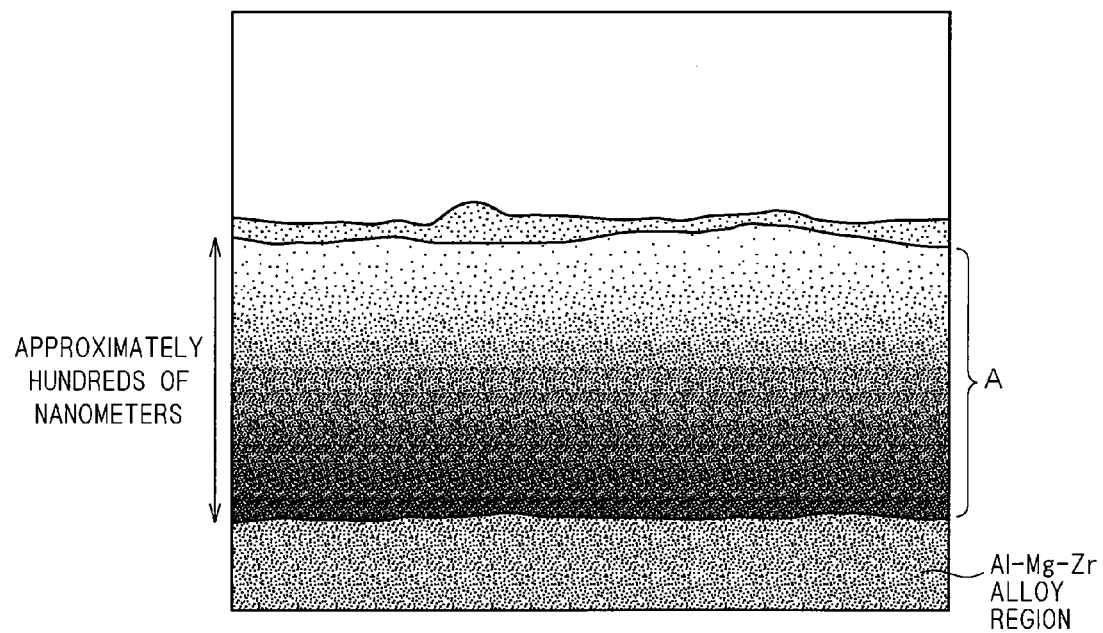
FIG. 5A is a schematic view of a film structure of an alumina film having an amorphous structure.

Under these conditions, the anodic oxidation is performed on the stage body 11 to form the dense alumina film A having a thickness of hundreds of nanometers on the holding surface 12 (See FIG. 5A). This alumina film A has an amorphous structure.

The thickness of the alumina film A formed herein is approximately hundreds of nanometers which is sufficiently thin relative to the aforementioned embossed configuration E. Thus, the influence of the formation of the alumina film A upon the embossed configuration E is negligible.

3. Effects

[Film of Insulator]

The alumina film A which is an insulator is formed on the holding surface 12 of the substrate stage 10. This enables the substrate stage 10 to have improved wear resistance as compared with a substrate stage with an Al—Mg—Zr alloy exposed at the surface of the stage body 11. Additionally, the substrate stage 10 according to this preferred embodiment produces the effect of suppressing separation electrification, as will be described below.

When a portion of a substrate is separated from a substrate stage with a conductive material (e.g., aluminum) exposed at the surface, a negative charge is generated on the substrate and a positive charge is generated on the stage because of an electrostatic phenomenon. Since the conductive material is exposed at the stage surface, the positive charge generated on the stage is discharged to a ground, and the stage is always kept having a high charge supply capability. For this reason, when another portion of the substrate is separated from the stage, a negative charge continues to be generated on the substrate because of the separation electrification. On the other hand, when a portion of a substrate is separated from the substrate stage 10 covered with the alumina film A which is an insulator, the negative and positive charges are also generated on the substrate and on the stage. However, the insulative layer formed on the stage surface prevents the positive charge generated on the stage from being discharged to the ground. Thus, the stage is kept having a low charge supply capability. This prevents the substrate separated from the stage from being negatively electrostatically charged, as portions of the substrate are sequentially separated from the stage.

As described above, the substrate stage 10 is prevented from exhibiting the separation electrification phenomenon because the holding surface 12 is covered with the alumina film A which is an insulator. Since the non-uniformity of the charges does not occur on the substrate after the substrate is separated from the substrate stage 10, this preferred embodiment avoids a damage to a device formed on the surface of the substrate, the adsorption of contaminants on the surface of the substrate, and the like.

[Amorphous Structure]

The alumina film A in the amorphous state is formed on the holding surface 12 of the substrate stage 10. This alumina film A is an extra-thin dense layer and has neither pin holes nor other holes formed therein. For this reason, the substrate stage 10 achieves high wear resistance and substantially prevents the separation electrification.

For example, an alumina film (referred to hereinafter as a "porous alumina film P") obtained by the conventional anodic oxidation is formed with a porous layer. The alumina film A, however, is formed with no porous layer. It should be noted that the conventional anodic oxidation process (or anodization process) is generally carried out under the following conditions:

1. An acid solution is used as the predetermined electrolytic solution (or chemical conversion solution). Specifically, a slightly acidic sulfuric acid aqueous solution (more specifically, a sulfuric acid aqueous solution having a concentration ranging from 10% to 20%), and a slightly acidic oxalic acid aqueous solution (more specifically, an oxalic acid aqueous solution having a concentration ranging from 1% to 10%) are used.

2. A voltage ranging from 10 to 50 V is applied as the constant voltage.

Figure 5B:
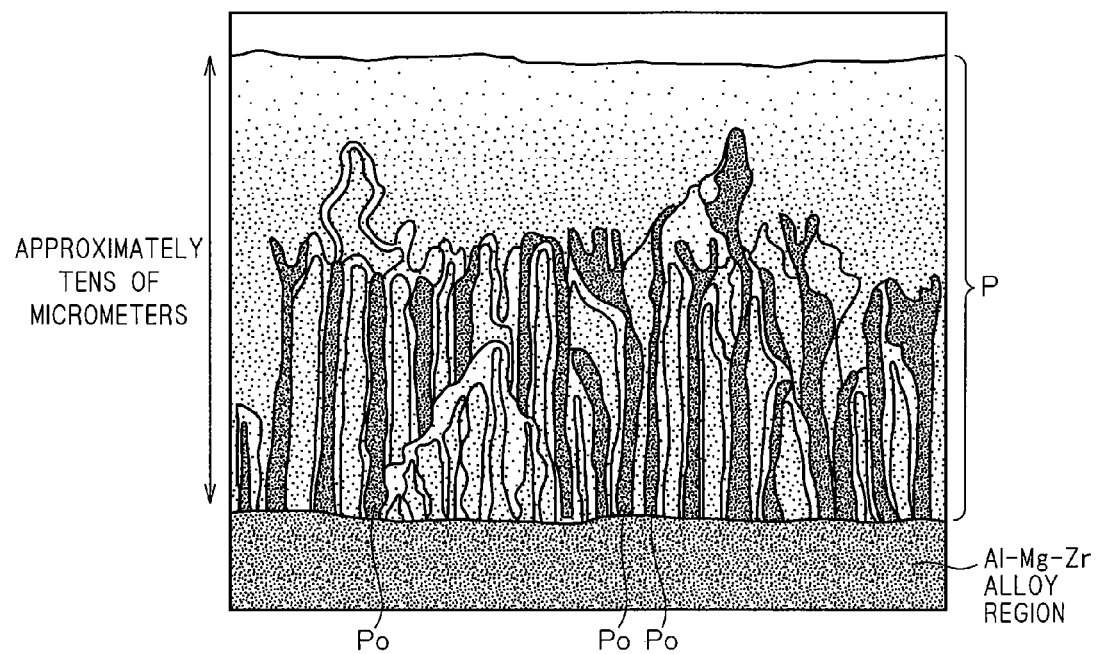
FIG. 5B is a schematic view of a film structure of a porous alumina film.

FIG. 5A is a schematic view of a film structure of the alumina film A in the amorphous state. FIG. 5B is a schematic view of a film structure of the porous alumina film P. As illustrated in FIGS. 5A and 5B, the alumina film A has a barrier layer having a thickness on the order of hundreds of nanometers, whereas the porous alumina film P has a double-layer structure composed of a barrier layer and a porous layer formed thereunder, and has a thickness on the order of tens of micrometers.

As shown in FIG. 5B, the porous alumina film P, which is formed by the anodic oxidation in the acid electrolytic solution, has an infinite number of pores or small holes Po formed therein by the solvent action of the electrolytic solution which is an acid solution. The separation electrification is liable to occur because these pores Po easily provide electrical connection between the substrate and the Al—Mg—Zr alloy region of the stage (i.e., the positive charge generated on the stage is discharged through the pores Po to a ground). On the other hand, the alumina film A in the amorphous state, which is formed by the anodic oxidation in the neutral electrolytic solution having no solvent action, does not have the pores Po which have been formed in the porous alumina film P, but has a defect-free amorphous structure. Thus, the alumina film A substantially prevents the separation electrification. Additionally, the alumina film A achieves excellent wear resistance because of the formation of the defect-free amorphous structure.

As a matter of course, the alumina film A having the amorphous structure (or in the amorphous state) has no grain boundaries which can become a cause of voids when subjected to a thermal shock, but is dense and strong. Thus, the alumina film A has excellent wear resistance and produces the great effect of suppressing the separation electrification, as compared with the porous alumina film P having a crystalline structure.

The thickness of the alumina film A is on the order of hundreds of nanometers, whereas the thickness of the porous alumina film P is on the order of tens of micrometers. In other words, the substrate stage 10 is capable of producing the above-mentioned effects by using the alumina film A having a thickness on the order of hundreds of nanometers. The alumina film A achieves the reduction in film thickness as compared with the porous alumina film P to reduce the influence of the formation of the film upon the thermal conductivity of the substrate stage 10.

[Embossing]

Additionally, the holding surface 12 of the substrate stage 10 has the embossed configuration E formed thereon.

The separation electrification depends on the contact area between the substrate and the holding surface 12. From a study by the present inventors, it has been shown that the formation of the embossed configuration as discussed above on the holding surface 12 prevents the separation electrification in an appropriate manner.

From a study by the present inventors, it has also been shown that the formation of the embossed configuration as discussed above on the holding surface 12 neither causes a temperature distribution exceeding ±1.6° C. (i.e., neither causes thermal non-uniformity) nor presents a problem with stress concentration during vacuum suction. Thus, the use of the substrate stage 10 having such an embossed configuration formed thereon as a cold plate and a hot plate produces the effect of accomplishing the uniform heat treatment of a substrate placed on the holding surface 12.

While the invention has been described in detail, the foregoing description is in all aspects illustrative and not restrictive. It is understood that numerous other modifications and variations can be devised without departing from the scope of the invention.

What is claimed is:

1. A substrate stage with a vacuum suction system for holding a substrate by suction applied through suction holes when said substrate is placed on said stage, comprising:
   a stage body having a holding surface for placing the substrate thereon; and
   a film of alumina in an amorphous state formed on said holding surface of said stage body, said film of alumina being configured to prevent separation electrification of said substrate, wherein,
   said film of alumina has a thickness in a range of hundreds of nanometers, and physical features obtained by being formed by an anodic oxidation process using a neutral electrolytic solution of $5<pH<9$ containing a nonaqueous solvent.

2. The substrate stage according to claim 1, wherein said holding surface has an embossed configuration formed thereon.

3. The substrate stage according to claim 2, wherein the total area of top surfaces of said embossed configuration is less than 50% of the whole area of said holding surface.

4. The substrate stage according to claim 3, wherein the top surfaces of said embossed configuration have a substantially circular configuration.

5. The substrate stage according to claim 4, wherein the top surfaces having said substantially circular configuration have a diameter of less than 5 mm.

6. The substrate stage according to claim 2, wherein
   said embossed configuration includes embossments having a height of less than 100 μm.

7. The substrate stage according to claim 1, wherein said stage body is made of pure aluminum.

8. The substrate stage according to claim 1, wherein said stage body is made of an aluminum alloy.

9. The substrate stage according to claim 1, wherein
   said anodic oxidation process is carried out by applying a predetermined voltage on said stage body in said electrolytic solution, and
   said predetermined voltage is at least 50 V and less than 200V.

10. The substrate stage according to claim 9, wherein said neutral electrolytic solution is a carboxylic acid solution having a concentration ranging from 0.1% to 10%.

* * * * *